(12) United States Patent
Fukami

(10) Patent No.: US 8,243,407 B2
(45) Date of Patent: Aug. 14, 2012

(54) SEMICONDUCTOR SWITCH CONTROL DEVICE

(75) Inventor: Ikuo Fukami, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 397 days.

(21) Appl. No.: 12/458,434

(22) Filed: Jul. 13, 2009

(65) Prior Publication Data

US 2010/0046123 A1 Feb. 25, 2010

(30) Foreign Application Priority Data

Aug. 19, 2008 (JP) ................................. 2008-210648

(51) Int. Cl.
*H02H 3/00* (2006.01)
(52) U.S. Cl. ........................................................ 361/78
(58) Field of Classification Search .................. 361/78
See application file for complete search history.

(56) References Cited

U.S. PATENT DOCUMENTS

| 5,898,557 | A | * | 4/1999 | Baba et al. ..................... 361/103 |
| 6,052,268 | A | * | 4/2000 | Thomas ........................ 361/103 |
| 2009/0046405 | A1 | * | 2/2009 | Ichikawa ...................... 361/103 |

FOREIGN PATENT DOCUMENTS

| JP | 64-37135 | 3/1989 |
| JP | 2000-299631 A | 10/2000 |

OTHER PUBLICATIONS

Xu Dewel et al., Power Loss Analysis of Power Semiconductor Devices and Power Converters, Tsinghua Univ (Sci & Tech), 2000, pp. 5-8, vol. 40, No. 3.

* cited by examiner

*Primary Examiner* — Rexford Barnie
*Assistant Examiner* — Ann Hoang
(74) *Attorney, Agent, or Firm* — Foley & Lardner LLP

(57) ABSTRACT

A semiconductor switch control device includes a current detecting unit that detects a current that flows in a semiconductor switch, a voltage detecting unit that detects a voltage, and a temperature detecting unit that detects a temperature. A transient thermal resistance value providing unit provides a transient thermal resistance value $Z_{th}$ in accordance with an elapsed time from reception of an excess voltage signal to a computing unit. A temperature detecting unit detects an initial temperature $T_{J0}$ when an excess voltage is produced. The computing unit calculates a temperature of the semiconductor switch by a following expression when a detected current value is represented by $I_{ds}$, and a detected voltage value is represented by $V_{ds}$: (expression): temperature of the semiconductor switch $T_J = I_{ds} \times V_{ds} \times Z_{th} + T_{J0}$.

5 Claims, 9 Drawing Sheets

PRIOR ART

SEMICONDUCTOR SWITCH CONTROL DEVICE

BACKGROUND

1. Field of the Invention

The present invention relates to a semiconductor switch control device, a semiconductor switch device, a load drive system, and a semiconductor switch control program. More specifically, the present invention relates to a semiconductor switch control device to protect a semiconductor switch from breakdown due to overload.

2. Description of Related Art

In recent years, computerization has been advancing in order to realize safety, comfort, and energy saving of automobiles. As an example, a mechanical relay has been replaced with a semiconductor switch, which contributes to downsizing of a device mounted on an automobile. Further downsizing has been required in the device, and in accordance therewith, miniaturization of a semiconductor chip design rule of a semiconductor switch has been advancing. More specifically, the size of a semiconductor chip has been gradually miniaturized from 1.2 µm, 1.0 µm, 0.5 µm, 0.35 µm, to 0.25 µm, and further miniaturization will be desired from now on.

Although the miniaturization of the design rule increases a density of a current that can be flowed in the semiconductor chip per unit area, a new problem of heating has been raised due to the increased current density. Especially, decrease of a breakdown tolerance due to heating in a transient state, mainly due to the heating in a load short-circuit, is a major problem. Electronic manufacturers and semiconductor manufacturers conduct research of a temperature detecting means, a current limiting means, a current detecting means and the like in order to protect semiconductor switches.

For example, a power supply control device is disclosed in a patent document 1 (Japanese Unexamined Patent Application Publication No. 2000-299631).

In FIG. 9, an ON resistance of a semiconductor switch 124 is employed as a load current detecting means. Then, a temperature of the semiconductor switch 124 is detected by temperature detecting means (D1 to D4, and a differential amplifier 105), a load current is detected by current detecting means (an ON resistance of the semiconductor switch 124 and a differential amplifier 106), and on the basis of the temperature detected result, the level of the reference potential of a comparator for judging an excess current is shifted by a driving control unit 107. When this temperature corrected reference potential is exceeded, an FET 102 is controlled to OFF. And in this way, an excess current braking function in the control of power supply from a power source 101 to a load 103 is provided.

According to this configuration, (1) heat loss of the power supply control device can be suppressed without using additional current sensing resistor (so-called shunt resistor), (2) the problem of the temperature dependency of the ON resistance of the semiconductor switch can be overcome by compensating the temperature upon detection of the load current and then the high-accuracy detection of the load current is realized, and (3) individual control for each load is enabled.

Further, a patent document 2 (Japanese Unexamined Utility Model Application Publication No. H1-37135) discloses a protection device of a power transistor.

In the patent document 2, each of a current that flows in a power transistor and a voltage that is applied is detected. Then, a product of the detected current and the voltage is calculated. Predicting an increase of the temperature when the value of the product of the current and the voltage is kept for a certain period of time, the power transistor is turned off after a certain delay time in accordance with the value of the product of the current and the voltage. By varying the time for the off control in accordance with the heating value, it is possible not to operate a protective function for the instantaneous excess current that does not cause the thermal destruction of the switch and to execute off control in accordance with time when increase of the temperature of the power transistor would cause destruction.

The off control by the current detection as disclosed in the patent document 1 appears effective. But we have now discovered that it is rarely used in practice due to its insufficiency of the response of a lamp-driven rush current as below. More specifically, when turning on the lamp as a load, the rush current that is six to ten times larger than a nominal rating current of the lamp. This rush current considerably varies depending on the temperature of the lamp itself, the voltage that is applied, and the lamp manufacturer and so on.

Further, a lamp that is not recommended by any manufacturer may be employed as a load by a user of an automobile. When the setting of the reference current $I_{ref}$ was improper, the rush current would exceed $I_{ref}$ in a lamp-driven lighting step, which makes it impossible to light the lamp due to the off control despite its normal state.

Furthermore, if the value of $I_{ref}$ is set to high in order to avoid such a situation, the semiconductor switch whose rated current is high is required to be used, which may increase the cost.

The patent document 2 solves the problem of the patent document 1 by considering the time elapse with the heating value, and turning off the semiconductor switch only when it is expected that the temperature of the semiconductor switch causes the thermal destruction. However we have now discovered that according to the patent document 2, the control is performed based on the heating value which is derived from the power consumption and its duration time. Any problem may be raised, for example, the semiconductor switch is destructed earlier than expected when the ambient temperature is high. On the other hand, when the ambient temperature is low, the semiconductor switch is frequently turned off even when there is no need to perform off control, which makes it impossible to realize stable operation.

SUMMARY

A first exemplary aspect of an embodiment of the present invention is a semiconductor switch control device that performs switching control of a semiconductor switch that switches power supply from a power source to a load, including a current detecting unit that detects a current that flows in the semiconductor switch, a voltage detecting unit that detects a voltage applied to the semiconductor switch, a temperature detecting unit that detects a temperature of the semiconductor switch, a computing unit that calculates the temperature of the semiconductor switch based on a detected current value that is detected by the current detecting unit, a detected voltage value that is detected by the voltage detecting unit, and a detected temperature value that is detected by the temperature detecting unit, and a driver that turns off the semiconductor switch when the temperature of the semiconductor witch calculated in the computing unit exceeds a set threshold value.

According to such a configuration, instead of sorely using a detection temperature and a power consumption, the temperature at that time is considered in addition to a current value and a voltage value, to thereby make it possible to obtain a temperature $T_j$ of a semiconductor switch depending on its situations at that time with high accuracy. As such, as the cutoff control can be executed so that the temperature of the semiconductor switch would not exceed the set value, the semiconductor switch can surely be protected from the thermal destruction. On the other hand, unnecessary cutoff is not performed when the temperature of the semiconductor switch is below the set temperature, whereby the semiconductor switch where the stable operation is possible can be operated with high accuracy and without failure.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

The first exemplary embodiment of the present invention will now be described.

Figure 1:
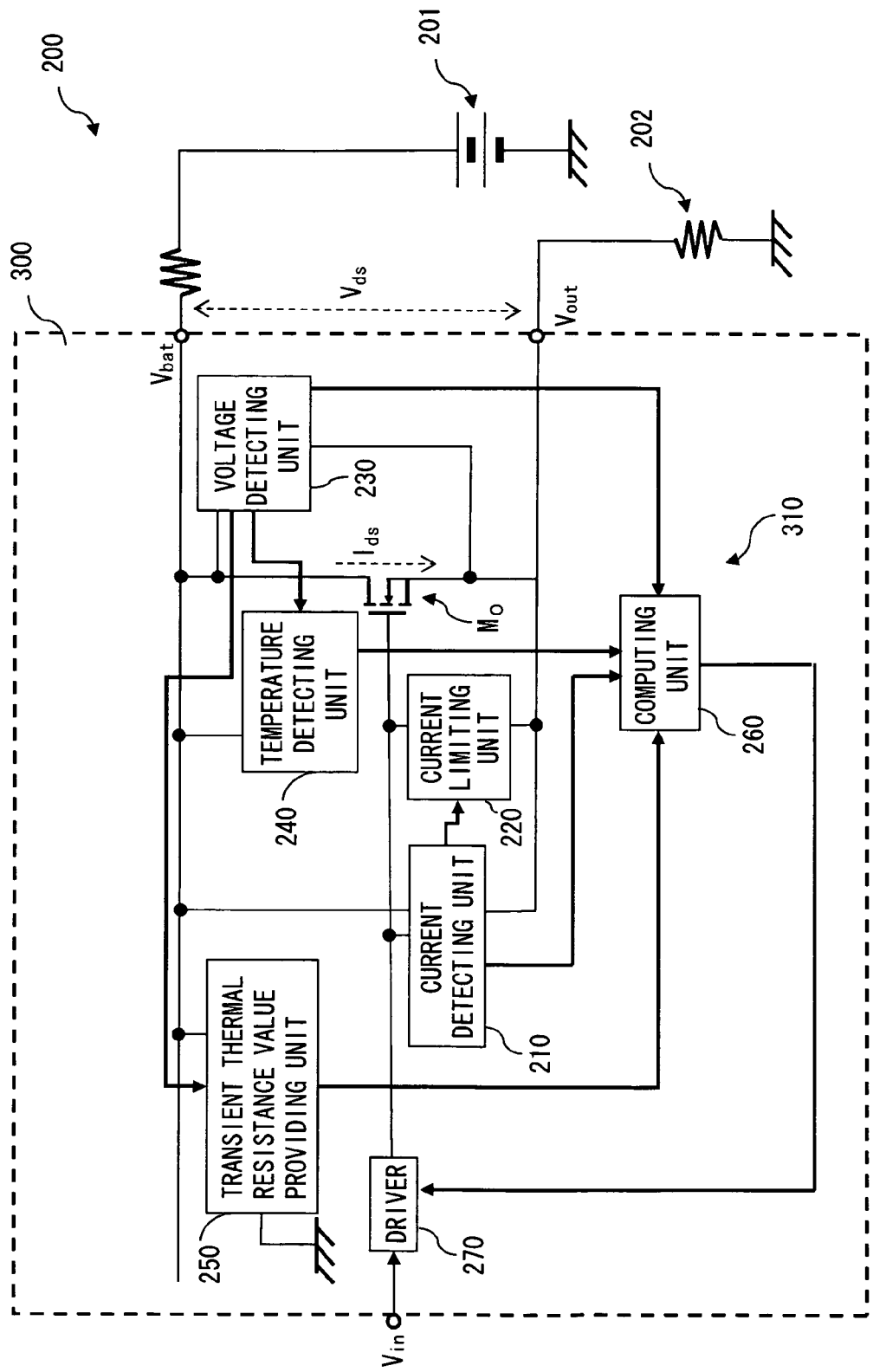
FIG. 1 is a diagram showing the configuration of a load drive system according to a first exemplary embodiment of the present invention.

FIG. 1 is a diagram showing the configuration of a load drive system 200.

The load drive system 200 has the configuration in which a current from a battery 201 is supplied to a load (lamp, for example) 202 through a semiconductor switch device 300.

The semiconductor switch device 300 includes a semiconductor switch $M_0$ between the battery 201 and the load 202.

Although an IGBT (Insulated Gate Bipolar Transistor), a power MOSFET, a bipolar transistor, and a MOS transistor and so on may be employed as the semiconductor switch $M_0$, it is not limited to them.

The semiconductor switch device 300 further includes a current detecting unit 210, a current limiting unit 220, a voltage detecting unit 230, a temperature detecting unit 240, a transient thermal resistance value providing unit 250, a computing unit 260, and a driver 270.

These current detecting unit 210, the current limiting unit 220, the voltage detecting unit 230, the temperature detecting unit 240, the transient thermal resistance value providing unit 250, the computing unit 260, and the driver 270 compose a semiconductor switch control device 310.

The current detecting unit 210 detects a current Ids that flows in the semiconductor switch $M_0$ to output a current signal $S_{Ids}$ based on the current $I_{ds}$ to the computing unit 260. Further, the current limiting unit 220 limits the current $I_{ds}$ that flows in the semiconductor switch $M_0$ to a current value $I_{limit}$ that is set in advance in order to prevent the current $I_{ds}$ from being exceeded.

Figure 2:
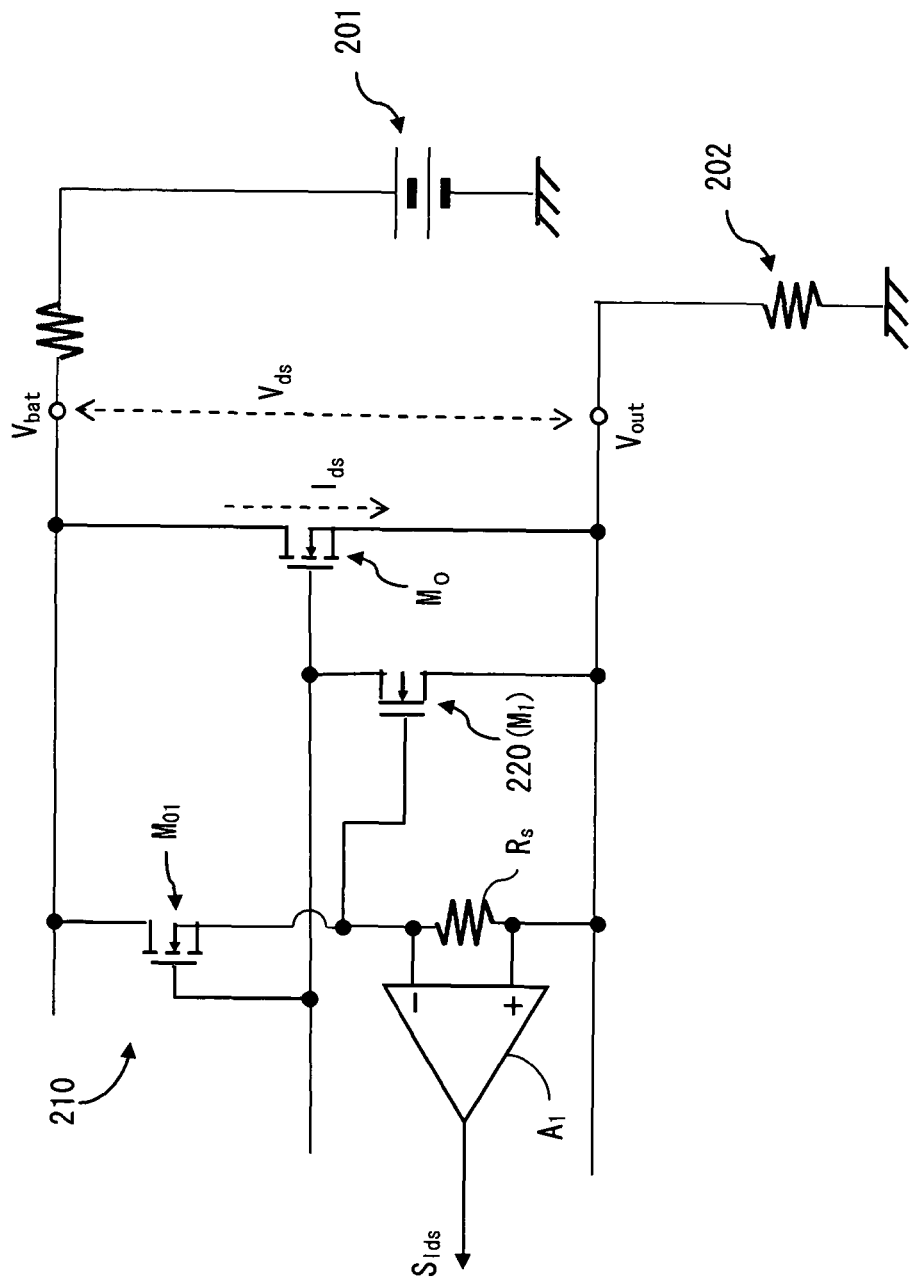
FIG. 2 is a diagram showing a configuration example of a current detecting unit and a current limiting unit according to the first exemplary embodiment.

Now, FIG. 2 shows a configuration example of the current detecting unit 210 and the current limiting unit 220.

In FIG. 2, $M_0$ is a semiconductor switch. Further, a parallel transistor $M_{01}$ is a transistor having the same configuration as the semiconductor switch $M_0$. A sense resistor $R_S$ is connected to a source side of the parallel transistor $M_{01}$, and the parallel transistor $M_{01}$ and the semiconductor switch $M_0$ have a common drain and a gate.

As such, a voltage that is proportional to the current $I_{ds}$ that flows in the semiconductor switch $M_0$ is produced in both ends of the sense resistor $R_S$. The voltage is amplified by a differential amplifier $A_1$, and is output to the computing unit 260 as a current value signal $S_{Ids}$.

Further, a switch $M_1$ is in ON state when the voltage that is produced in both ends of the sense resistor $R_S$ becomes higher, and a gate potential of the semiconductor switch $M_0$ is limited.

As the gate potential of the semiconductor switch $M_0$ is limited, the current $I_{ds}$ that flows in the semiconductor switch $M_0$ is limited. The limit current value $I_{limit}$ is set to a value that does not exceed a fusing current of a bonding wire. The magnitude of the limit current value $I_{limit}$ is set and adjusted by adjusting the impedance of the driver 270, the switch $M_1$, and the sense resistor $R_S$.

Now, the current detecting unit 210 is composed of the parallel transistor $M_{01}$, the sense resistor $R_S$, and the differential amplifier $A_1$, and the current limiting unit 220 is composed of the switch $M_1$.

The voltage detecting unit 230 detects a potential difference $V_{ds}$ between a drain and a source of the semiconductor switch $M_0$ and outputs the potential difference $V_{ds}$ to the computing unit 260. When the load 202 is in a load short-circuit state due to any failure, in other words, when the voltage between the drain and the source of the semiconductor switch $M_0$ becomes high ($V_{ds}$>3V, for example), the voltage detecting unit 230 outputs an excess voltage signal.

Figure 3:
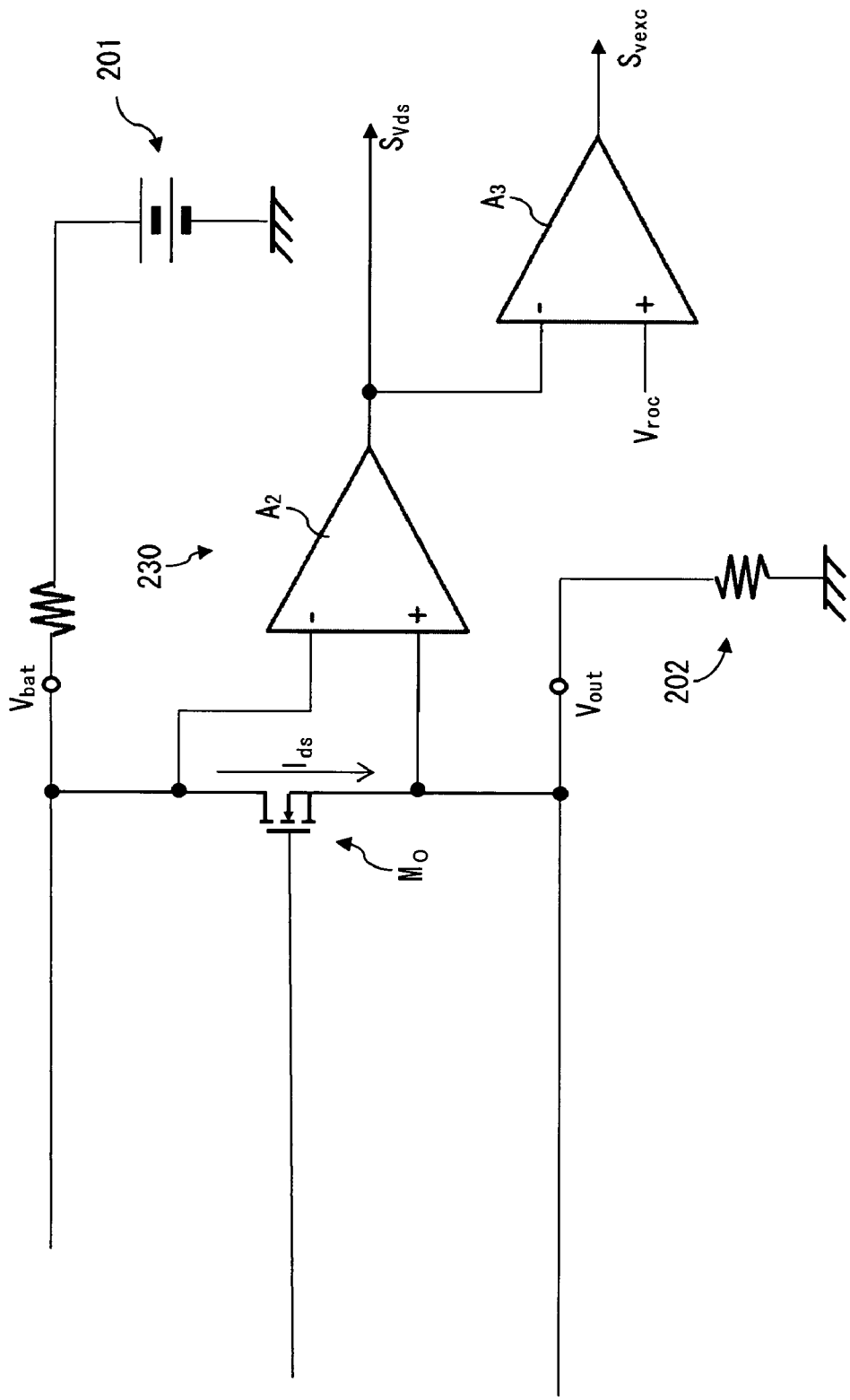
FIG. 3 is a diagram showing a configuration example of a voltage detecting unit according to the first exemplary embodiment.

FIG. 3 shows an example of the voltage detecting unit 230.

The voltage $V_{ds}$ between the drain and the source of the semiconductor switch $M_0$ is amplified by a differential amplifier $A_2$ and output as a detected voltage value $S_{Vds}$. Further, a voltage limit value $V_{roc}$ is set in advance.

The voltage limit value $V_{roc}$ may be a value that corresponds to the detected voltage value $S_{Vds}$ when the voltage $V_{ds}$ between the drain and the source of the semiconductor switch $M_0$ is 3 V as an example. However, it may be set as appropriate in accordance with a withstand voltage of the semiconductor switch $M_0$.

When the detected voltage value $S_{Vds}$ exceeds the voltage limit value $V_{roc}$, an excess voltage signal $S_{Vexc}$ is output from a differential amplifier $A_3$. The excess voltage signal $S_{Vexc}$ is an operation trigger signal of the temperature detecting unit 240 and the transient thermal resistance value providing unit 250.

The temperature detecting unit 240 holds an initial temperature $T_{J0}$ of the semiconductor switch $M_0$ and outputs the value to the computing unit 260 by the excess voltage signal $S_{Vexc}$ as a trigger.

Figure 4:
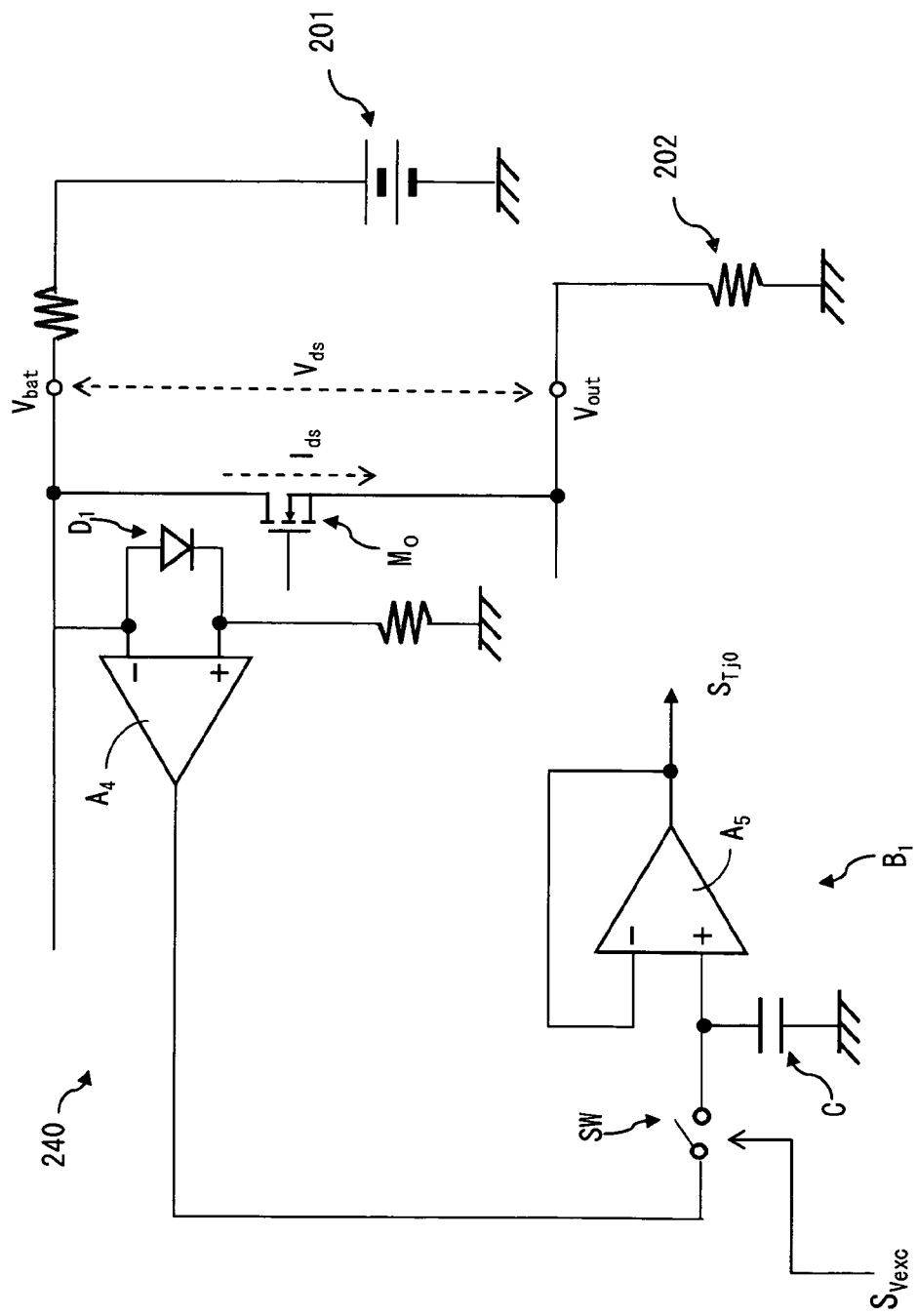
FIG. 4 is a diagram showing a configuration example of a temperature detecting unit according to the first exemplary embodiment.

An example of the temperature detecting unit 240 is shown in FIG. 4.

The temperature characteristics of the voltage decrease of a diode $D_1$ arranged near the semiconductor switch $M_0$ is output to a buffer $B_1$ by a differential amplifier $A_4$. The buffer $B_1$ includes a differential amplifier $A_5$ and a capacitor C for fixing the potential that is arranged in a non-inverting input terminal of the differential amplifier $A_5$, and a switch SW is further arranged in a former stage of the capacitor C.

The switch SW is opened by the excess voltage signal $S_{Vexc}$ from the voltage detecting unit 230, and the input voltage is held by the capacitor C.

The buffer $B_1$ outputs the voltage of the non-inverting input terminal as a temperature signal $S_{TJ0}$.

The transient thermal resistance value providing unit 250 calculates a transient thermal resistance value Zth that is time-dependent from when the load short-circuit occurs, and outputs the transient thermal resistance value Zth to the computing unit 260.

Figure 5:
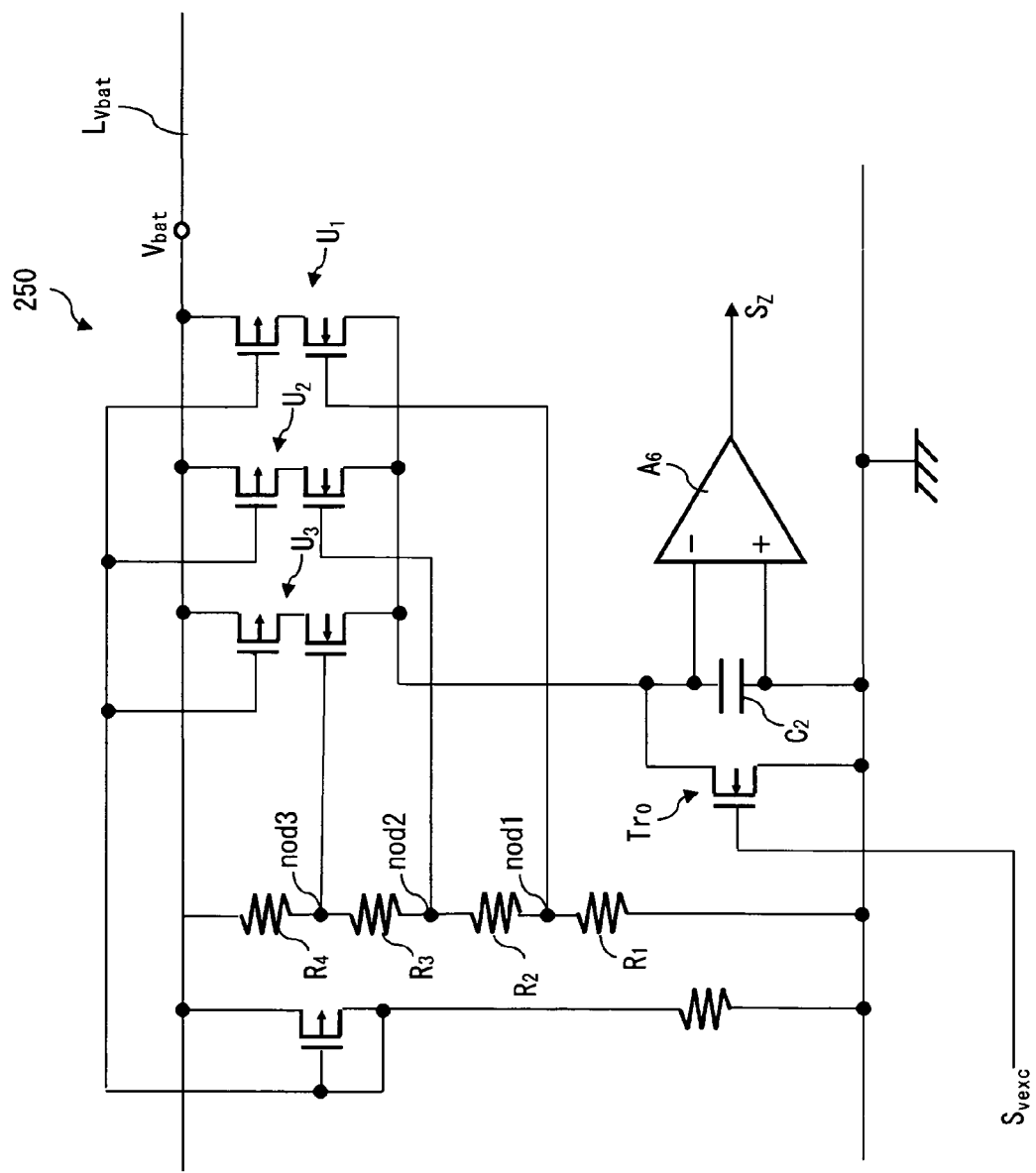
FIG. 5 is a diagram showing a configuration example of a transient thermal resistance value providing unit according to the first exemplary embodiment.

FIG. 5 shows an example of the transient thermal resistance value providing unit 250.

A MOS transistor $Tr_0$ that is connected to a capacitor $C_2$ in parallel is cut off by the excess voltage signal $S_{Vexc}$ from the voltage detecting unit 230, and charge is stored in the capacitor by a constant current. The voltage decrease of the capacitor $C_2$ is amplified by a differential amplifier $A_6$, and is output as a transient thermal resistance signal.

As the transient thermal resistance is non-linear with respect to time, the constant current that is flowed in the capacitor $C_2$ is changed depend on the voltage decrease, so as to adjust the characteristics. In summary, serial units $U_1$, $U_2$, and $U_3$ of a pMOS transistor and an nMOS transistor are arranged in parallel between the capacitor $C_2$ and a line $L_{Vbat}$ to which the drain of the semiconductor switch $M_0$ is connected.

Further, four resistors are connected in series between the line $L_{Vbat}$ and the ground power supply GND. Then, resistors are called $R_1$, $R_2$, $R_3$, $R_4$ from the ground power supply side, and a part between $R_1$ and $R_2$ is called $nod_1$, a part between $R_2$ and $R_3$ is called $nod_2$, and a part between $R_3$ and $R_4$ is called $nod_3$.

The gate of the nMOS transistor of the unit $U_1$ is connected to the $nod_1$, the gate of the nMOS transistor of the unit $U_2$ is connected to the $nod_2$, and the gate of the nMOS transistor of the unit $U_3$ is connected to the $nod_3$.

In this configuration, the potential from the $nod_1$ to the $nod_3$ varies along with the time, and the nMOS transistors are sequentially turned on in accordance with the potential of each nod.

Figure 6:
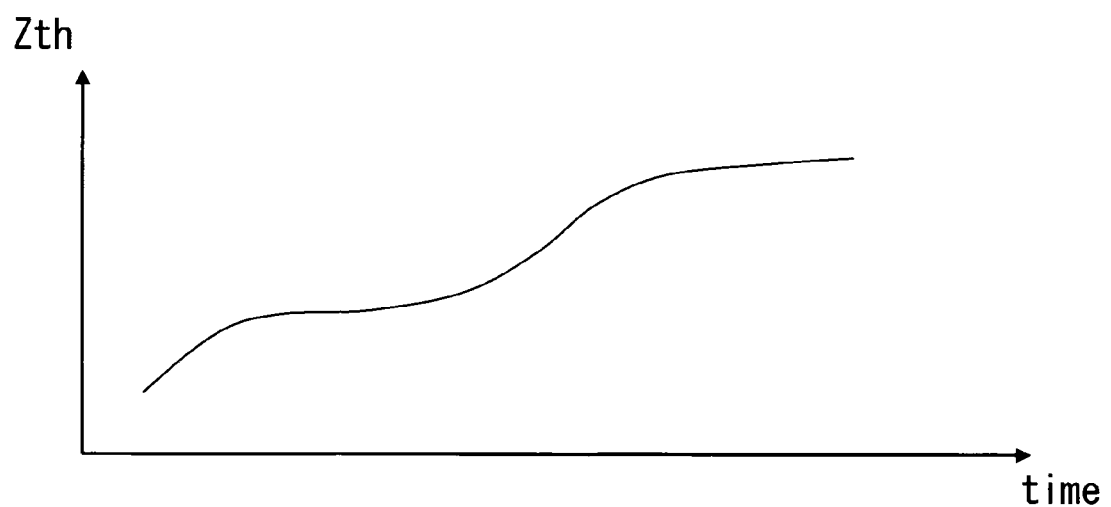
FIG. 6 is a diagram showing an example of transient thermal resistance characteristics provided by the transient thermal resistance value providing unit according to the first exemplary embodiment.

Thus, the transient thermal resistance signal $S_Z$ in accordance with the non-linear transient thermal resistance characteristics as shown in FIG. 6 is output from the transient thermal resistance value providing unit.

The computing unit 260 calculates a junction temperature $T_J$ of the semiconductor switch $M_0$, and when the junction temperature $T_J$ of the semiconductor switch $M_0$ exceeds a preset temperature (175° C., for example), the cutoff control is executed in order to protect the semiconductor switch $M_0$ from thermal destruction.

Now, the junction temperature $T_J$ of the semiconductor switch $M_0$ is obtained by the following Expression 1.

$$T_J = I_{ds} \times V_{ds} \times Z_{th} + T_{J0} \qquad \text{(Expression 1)}$$

Figure 7:
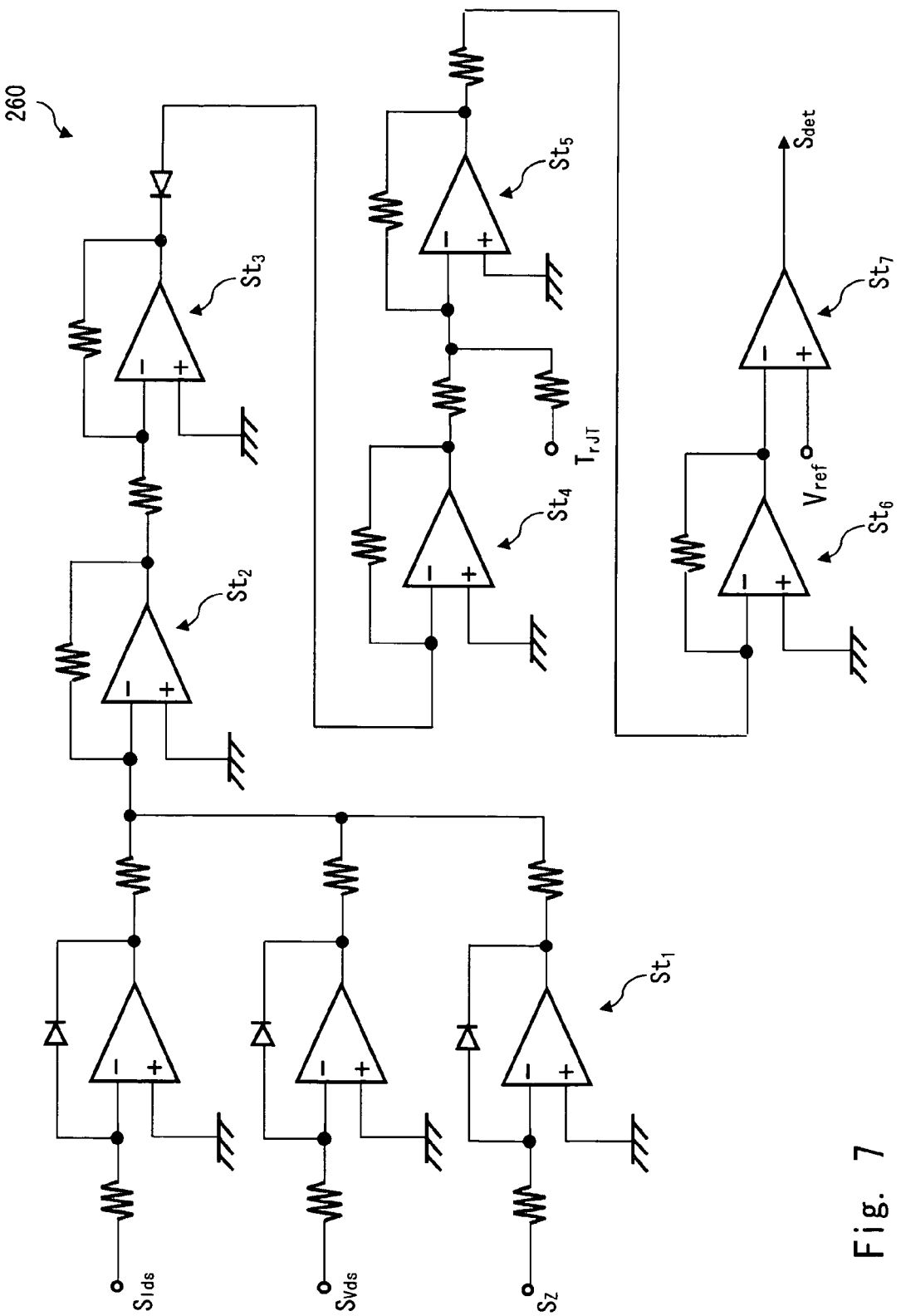
FIG. 7 is a diagram showing a configuration example of a computing unit according to the first exemplary embodiment.

A configuration example of the computing unit 260 is shown in FIG. 7.

A first stage $St_1$ represents a logarithm converter, which is supplied with the current signal $S_{Ids}$, the voltage signal $S_{Vds}$, and the transient thermal resistance signal $S_Z$. A second stage $St_2$ is an adder, which adds values obtained by logarithm-converting the aforementioned signals.

The voltage is inversed in a third stage $St_3$, and an inverse logarithm converter in a fourth stage $St_4$ realizes the following multiplication. (current signal $S_{Ids}$)×(voltage signal $S_{Vds}$)×(transient thermal resistance signal $S_Z$)

In a fifth stage $St_5$, the temperature signal $S_{TJ0}$ is added, and the voltage is inversed in a sixth stage $St_6$. In a seventh stage $St_7$, the value is compared with a predetermined temperature threshold value ($V_{rJt}$). If the value exceeds the predetermined value, a junction temperature detection signal $S_{det}$ is output to the driver 270.

The driver 270 cuts off the semiconductor switch $M_0$ upon receiving the junction temperature detection signal $S_{det}$.

According to the first exemplary embodiment having such a configuration, the following effects can be achieved.

(1) In the first exemplary embodiment, the junction temperature $T_J$ of the semiconductor switch $M_0$ is obtained from the (Expression 1) by computing in the computing unit 260 not only from the voltage value $V_{ds}$ and the current value $I_{ds}$ flowing in the semiconductor switch $M_0$ but also with the transient thermal resistance value Zth that depends on the time from the occurrence of the load short-circuit and the temperature $T_{J0}$ of the semiconductor switch $M_0$ when the excess voltage is started to flow (when the load short-circuit occurs).

From the aforementioned description, the transient thermal resistance characteristics and the temperature when the excess voltage occurs are considered in addition to the electric energy by the current and the voltage, whereby the junction temperature $T_J$ of the semiconductor switch $M_0$ can be obtained in high accuracy depending on its situations.

Accordingly, the cutoff control can be carried out so that the junction temperature $T_J$ of the semiconductor switch $M_0$ does not exceed the set value, whereby the semiconductor switch $M_0$ can surely be protected from the thermal destruction. On the other hand, unnecessary cutoff is not performed when the junction temperature $T_J$ of the semiconductor switch $M_0$ is below the set temperature, whereby the semiconductor switch $M_0$ where the stable operation is possible can be operated with high accuracy and without failure.

There may be also a method in which a temperature sensor is provided in a vicinity of the semiconductor switch to turn off the semiconductor switch when the temperature detected by the temperature sensor exceeds the heat resistant temperature of the semiconductor switch. However, even when the temperature sensor is arranged and formed in the vicinity of the semiconductor switch, the temperature sensor cannot follow the instantaneous heating speed of the semiconductor switch due to the power consumption in the load short-circuit. Thus, such a configuration does not function in a real load short-circuit, and the semiconductor switch is often damaged by the thermal destruction. Even when it functions, serious damage may be caused to the semiconductor switch, which results in rapid deterioration of the semiconductor switch.

On the other hand, according to the exemplary embodiment, instead of simply performing the temperature detection, the temperature of the semiconductor switch $M_0$ is accurately estimated from the transient thermal resistance $Z_{th}$, the voltage decrease $V_{ds}$, the current value $I_{ds}$, and the junction temperature $T_{J0}$ in the occurrence of the load short-circuit of the semiconductor switch, whereby it is possible to respond to the instantaneous heating speed of the semiconductor switch $M_0$ and to prevent the thermal destruction and the degradation of the semiconductor switch $M_0$.

(2) Further, as the OFF control of the semiconductor switch based simply on the result of the current sensing is not performed in the first exemplary embodiment, the driving of the load under normal environment may be definitely performed.

(3) Further, when the excess current flows in the semiconductor switch $M_0$, the current that flows in the semiconductor switch $M_0$ is limited by the current limiting unit 220. Thus, it is possible to suppress the excess current and to protect the semiconductor switch $M_0$. For example, the bonding wire of the semiconductor switch $M_0$ may be protected.

Second Exemplary Embodiment

Now, the second exemplary embodiment of the present invention will be described.

Figure 8:
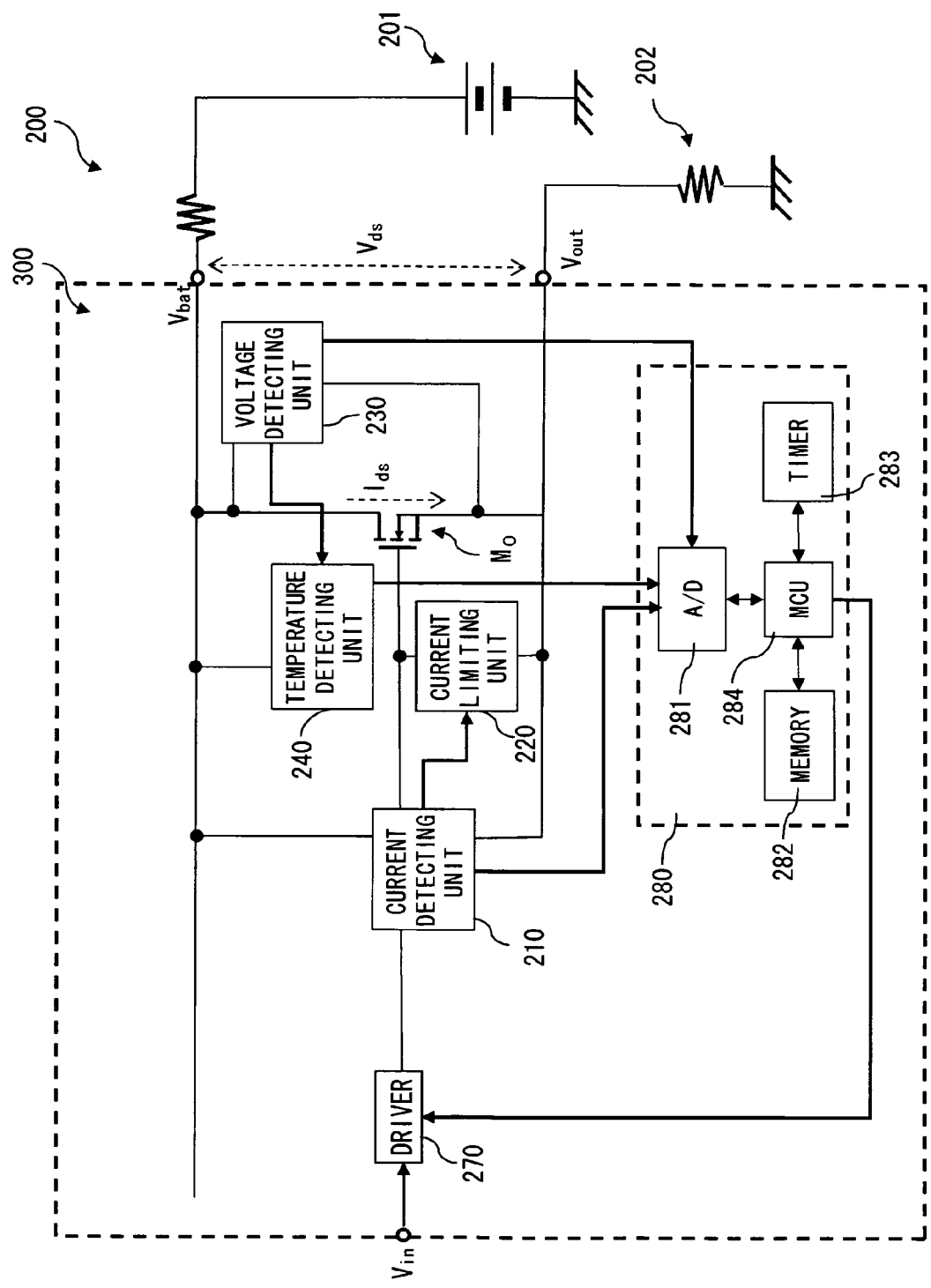
FIG. 8 is a diagram showing the configuration according to a second exemplary embodiment.
Figure 9:
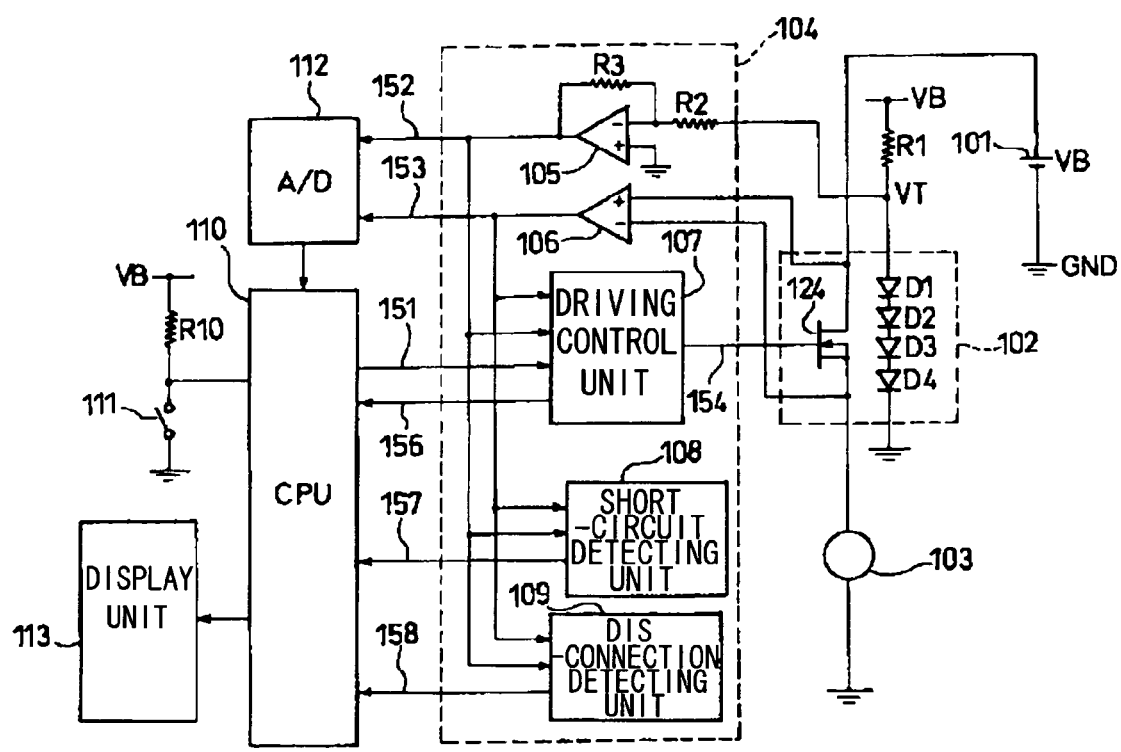
FIG. 9 is a diagram showing a related art.

FIG. 8 shows the configuration of the second exemplary embodiment.

Although the basic configuration of the second exemplary embodiment is similar to that of the first exemplary embodiment, the second exemplary embodiment has a characteristic feature in that the transient thermal resistance value providing unit and the computing unit are formed in programmable ways with software.

In FIG. 8, a semiconductor switch device 300 includes a computing control unit 280, and the computing control unit 280 includes an A/D converter (analog/digital converter) 281, a memory 282, a timer 283, and an MCU (micro controller unit) 284.

The A/D converter 281 A/D-converts the detection signals from the current detecting unit 210, the temperature detecting unit 240, and the voltage detecting unit 230 and outputs the signals to the MCU 284.

The characteristics of the transient thermal resistance value of the semiconductor switch $M_0$ is stored in the memory 282 in advance. The memory thus forms a transient thermal resistance value providing unit. Further, the heat resistant temperature threshold value of the semiconductor switch $M_0$ is set in the memory 282.

The timer 283 is activated as the MCU 284 has received the excess voltage signal $S_{Vexc}$, and constantly outputs the elapsed time from the start-up to the MCU 284.

The MCU (micro controller unit) includes a CPU and a main memory, for example, and executes the control program of the semiconductor switch. More particularly, the junction temperature $T_J$ of the semiconductor switch $M_0$ is calculated by the control program of the semiconductor switch, and the control signal is output to the driver 270 in accordance with the junction temperature $T_J$.

The computing unit is composed of the MCU.

In such a configuration, each output of the current detecting unit 210, the voltage detecting unit 230, and the temperature detecting unit 240 is transmitted to the micro controller unit (MCU) 284 through the A/D converter 281. When the load 202 becomes in a load short-circuit state due to any failure, in other words, when the voltage $V_{ds}$ between the drain and the source of the semiconductor switch $M_0$ becomes high ($V_{ds}$>3V, for example), the following processing is executed.

In summary, the temperature detecting unit 240 detects the temperature $T_{J0}$ of the semiconductor switch $M_0$ by the excess voltage signal $S_{Vexc}$ by the voltage detecting unit 230 as a trigger, and supplies the temperature $T_{J0}$ to the micro controller unit 284 through the A/D converter 281. Then, the micro controller unit 284 holds the initial junction temperature $T_{J0}$ in the micro controller unit. The micro controller unit 284 activates the timer 283 at the same time as the hold of the initial junction temperature $T_{J0}$. The timer 283 constantly outputs the elapsed time from the start-up to the micro controller unit 284. The micro controller unit 284 obtains the transient thermal resistance value Zth that corresponds to the elapsed time received from the timer 283 by referring to the transient thermal resistance characteristics of the memory 282. Then, the micro controller unit 284 calculates the junction temperature $T_J$ of the semiconductor switch by the following calculation.

$$T_J = I_{ds} \times V_{ds} \times Z_{th} + T_{J0}$$

When the junction temperature $T_J$ of the semiconductor switch $M_0$ which is the calculation result exceeds the temperature that is set in advance, the micro controller unit 284 indicates the driver 270 to cut off the semiconductor switch $M_0$.

Note that limiting the current volume flowing in the semiconductor switch $M_0$ to the predetermined current value $I_{limit}$ to prevent the overcurrent by the current limiting unit 220 at the same time as the above control operation is similar to the operation of the first exemplary embodiment.

According to the second exemplary embodiment, as the computing control unit 280 is formed by software, various parameters can be readily set or changed to optimal values in accordance with the characteristics of the load, the semiconductor switch, and requirement by a user. As a result, optimal control in accordance with the application can be performed and products with increased availability that meet the requirement of a user can be offered.

The present invention is not limited to the above-described exemplary embodiments, but various modifications may be made without departing from the spirit of the present invention that is already described.

Although the configuration including the current limiting unit is shown as the semiconductor switch controlling unit (semiconductor switch control device), the current limiting unit may be omitted as long as the main purpose of protecting the semiconductor switch from the thermal destruction is attained without the current limiting unit.

Although the temperature detecting unit detects the temperature by the diode that is arranged near the semiconductor switch in the above exemplary embodiments, a plurality of diodes may be arranged instead of one, or a bipolar transistor may be employed instead of the diode.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor switch control device that performs switching control of a semiconductor switch that switches power supply from a power source to a load, comprising:
   a current detecting unit that detects a current that flows in the semiconductor switch;
   a voltage detecting unit that detects a voltage applied to the semiconductor switch;
   a temperature detecting unit that detects a temperature of the semiconductor switch;
   a computing unit that calculates the temperature of the semiconductor switch based on a detected current value that is detected by the current detecting unit, a detected voltage value that is detected by the voltage detecting unit, and a detected temperature value that is detected by the temperature detecting unit;

a driver that turns off the semiconductor switch when the temperature of the semiconductor switch calculated in the computing unit exceeds a set threshold value;

a transient thermal resistance value providing unit that obtains transient thermal resistance characteristics of the semiconductor switch along with time elapse and outputs the transient thermal resistance characteristics, wherein the voltage detecting unit outputs an excess voltage signal when the detected voltage exceeds a set threshold value;

the transient thermal resistance value providing unit provides a transient thermal resistance value $Z_{th}$ in accordance with an elapsed time from reception of the excess voltage signal to the computing unit;

when the temperature detecting unit receives the excess voltage signal from the voltage detecting unit, the temperature detecting unit detects a temperature of the semiconductor switch at this time, and outputs the detected temperature to the computing unit as an initial temperature $T_{J0}$, and the computing unit calculates a temperature $T_J$ of the semiconductor switch by a following expression, where the detected current value is represented by $I_{ds}$, and the detected voltage value is represented by $V_{ds}$:

(expression): temperature of the semiconductor switch $T_J = I_{ds} \times V_{ds} \times Z_{th} \times T_{J0}$.

2. The semiconductor switch control device according to claim 1, comprising:

a current limiting unit including a switch that is connected to a gate of the semiconductor switch, the switch being in an ON state in accordance with a value of a current that flows in the current detecting unit; and the current limiting unit makes the switch be in an ON state to limit a gate potential of the semiconductor switch when the current flowing in the current detecting unit exceeds a predetermined limit current value, whereby the current limiting unit limits a current value flowing in the semiconductor switch.

3. A semiconductor switch device that comprises the semiconductor switch control device according to claim 1, and a semiconductor switch controlled by the semiconductor switch device.

4. A load drive system that comprises the semiconductor switch device according to claim 3, and a load that is supplied with power through the semiconductor switch device.

5. A semiconductor switch control device that comprises a current detecting unit that performs switching control of a semiconductor switch that switches power supply from a power source to a load to detect a current that flows in the semiconductor switch; a voltage detecting unit that detects a voltage applied to the semiconductor switch; a temperature detecting unit that detects a temperature of the semiconductor switch; and a driver that turns off the semiconductor switch when the temperature of the semiconductor switch exceeds a set threshold value; and a computer, wherein a semiconductor switch control program product stored in a computer readable medium causes the computer to operate as:

a transient thermal resistance value providing unit that calculates a transient thermal resistance value $Z_{th}$ of the semiconductor switch in accordance with an elapsed time from when it is detected by the voltage detecting unit that an excess voltage is applied to the semiconductor switch;

a computing unit that computes the temperature of the semiconductor switch based on a detected current value, a detected voltage value, a detected temperature value, and the transient thermal resistance value;

when the temperature detecting unit receives the excess voltage signal from the voltage detecting unit, the temperature detecting unit detects a temperature of the semiconductor switch at this time, and outputs the detected temperature to the computing unit as an initial temperature $T_{J0}$, and the computing unit calculates a temperature $T_J$ of the semiconductor switch by a following expression, where the detected current value is represented by $I_{ds}$, and the detected voltage value is represented by $V_{ds}$:

(expression): temperature of the semiconductor switch $T_J = I_{ds} \times V_{ds} \times Z_{th} \times T_{J0}$.

* * * * *